US009741823B1

United States Patent
Greene et al.

(10) Patent No.: US 9,741,823 B1
(45) Date of Patent: Aug. 22, 2017

(54) FIN CUT DURING REPLACEMENT GATE FORMATION

(71) Applicant: INTERNATIONAL BUSINESS MACHINES CORPORATION, Armonk, NY (US)

(72) Inventors: Andrew M. Greene, Albany, NY (US); Balasubramanian S. Pranatharthiharan, Watervliet, NY (US); Sivananda K. Kanakasabapathy, Niskayuna, NY (US); John R. Sporre, Albany, NY (US)

(73) Assignee: Internation Business Machines Corporation, Armonk, NY (US)

( * ) Notice: Subject to any disclaimer, the term of this patent is extended or adjusted under 35 U.S.C. 154(b) by 0 days.

(21) Appl. No.: 15/336,886

(22) Filed: Oct. 28, 2016

(51) Int. Cl.
| | | |
|---|---|---|
| *H01L 21/8234* | (2006.01) | |
| *H01L 29/66* | (2006.01) | |
| *H01L 29/78* | (2006.01) | |
| *H01L 29/161* | (2006.01) | |
| *H01L 21/308* | (2006.01) | |

(52) U.S. Cl.
CPC .... *H01L 29/66545* (2013.01); *H01L 21/3086* (2013.01); *H01L 29/161* (2013.01); *H01L 29/66795* (2013.01); *H01L 29/785* (2013.01)

(58) Field of Classification Search
None
See application file for complete search history.

(56) References Cited

U.S. PATENT DOCUMENTS

| | | | | |
|---|---|---|---|---|
| 7,315,994 | B2 * | 1/2008 | Aller | G06F 17/5068 716/106 |
| 8,440,517 | B2 * | 5/2013 | Lin | H01L 29/66795 257/E21.224 |
| 8,617,961 | B1 | 12/2013 | Haran et al. | |
| 8,906,807 | B2 | 12/2014 | Bergendahl et al. | |
| 9,147,730 | B2 | 9/2015 | Xie et al. | |
| 9,190,487 | B2 | 11/2015 | Khakifirooz et al. | |
| 9,236,267 | B2 | 1/2016 | De et al. | |
| 9,263,516 | B1 * | 2/2016 | Wu | H01L 21/76224 |
| 9,362,181 | B1 * | 6/2016 | Xie | H01L 21/823878 |
| 9,455,198 | B1 * | 9/2016 | Yu | H01L 21/823481 |
| 9,607,985 | B1 * | 3/2017 | Tseng | H01L 27/0886 |
| 2015/0194335 | A1 | 7/2015 | Tsai et al. | |
| 2015/0255543 | A1 | 9/2015 | Cheng et al. | |
| 2016/0035628 | A1 | 2/2016 | Tsujita et al. | |

* cited by examiner

*Primary Examiner* — Cuong Q Nguyen
*Assistant Examiner* — Nishath Yasmeen
(74) *Attorney, Agent, or Firm* — Tutunjian & Bitetto, P.C.; Vazken Alexanian

(57) ABSTRACT

A method is presented for forming a semiconductor structure. The method includes forming a plurality of vertical fins over a semiconductor layer formed over a substrate, depositing an oxide over the plurality of fins, and applying a cutting mask over a portion of the plurality of fins. The method further includes removing the oxide from the exposed portion of the plurality of fins, depositing a replacement gate stack, and etching portions of the replacement gate stack to remove exposed fins, the exposed fins forming recesses within the semiconductor layer. The method further includes depositing a spacer over the exposed fins and the recesses formed by the removed fins. A portion of the plurality of fins are cut during etching of the replacement gate stack and a portion of the oxide is removed before deposition of the replacement gate stack.

10 Claims, 7 Drawing Sheets

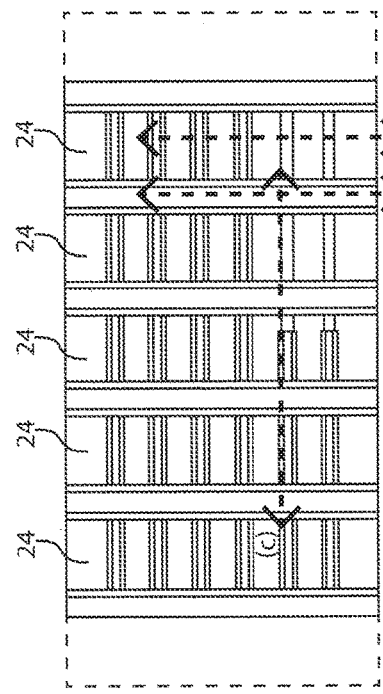
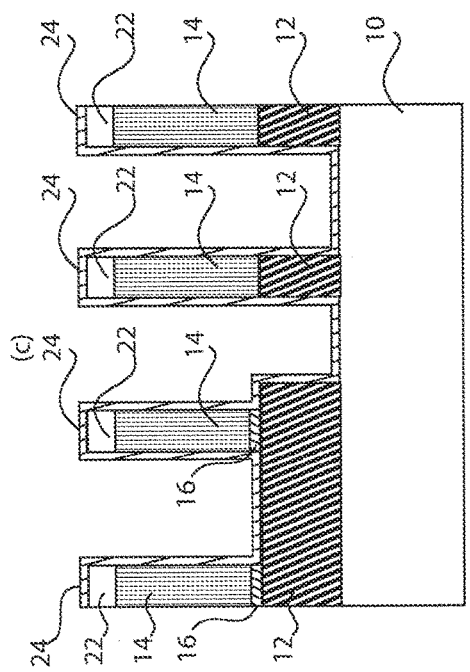
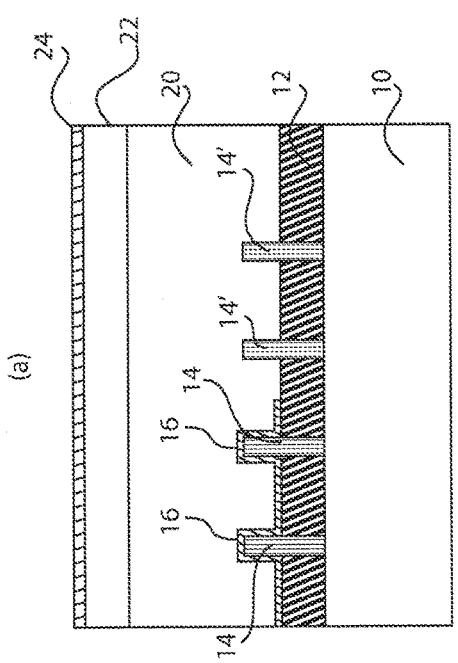
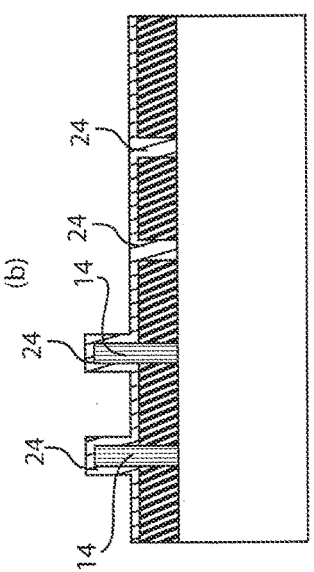
FIG. 10
FIG. 11
FIG. 12
FIG. 13

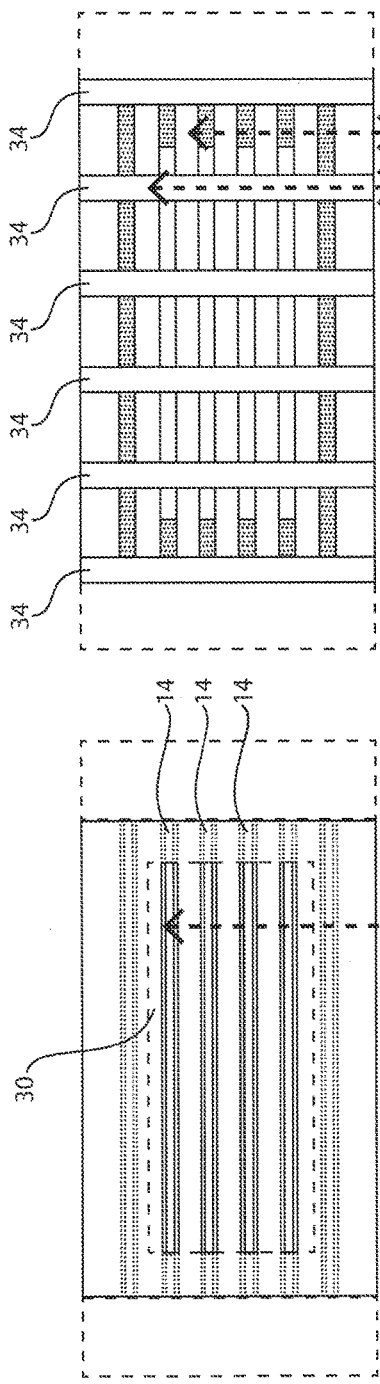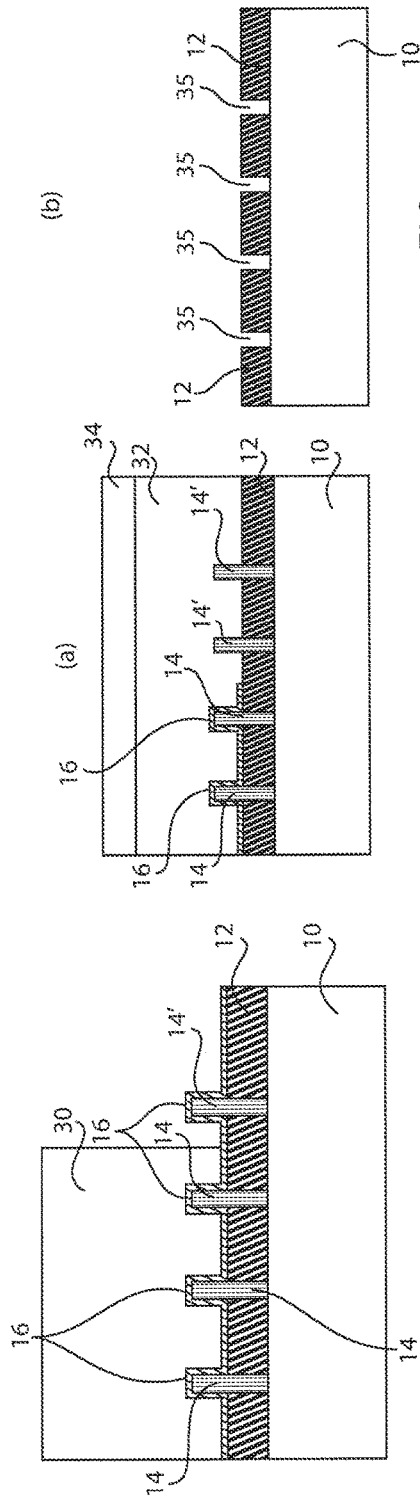

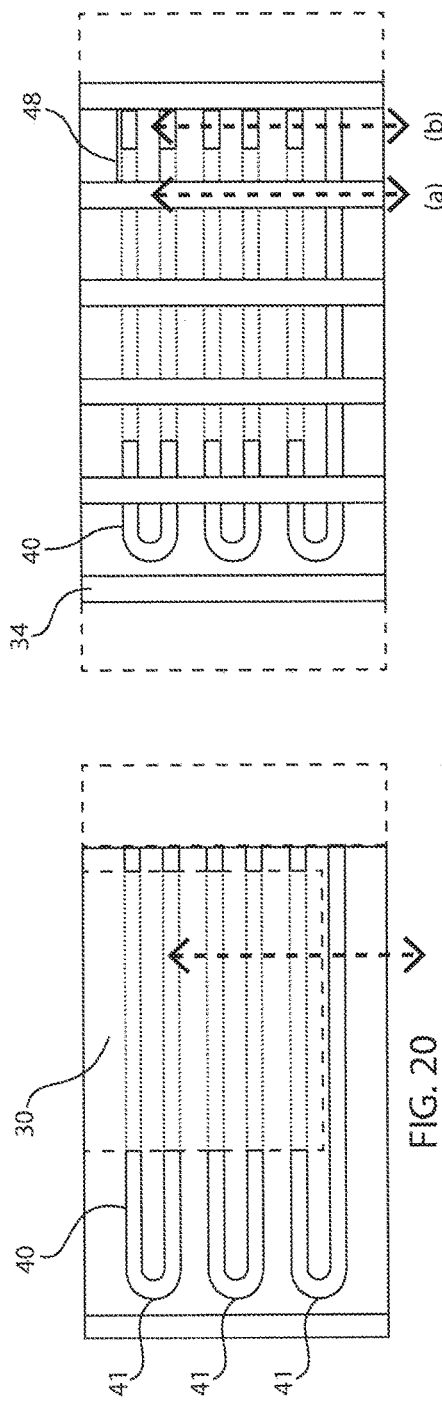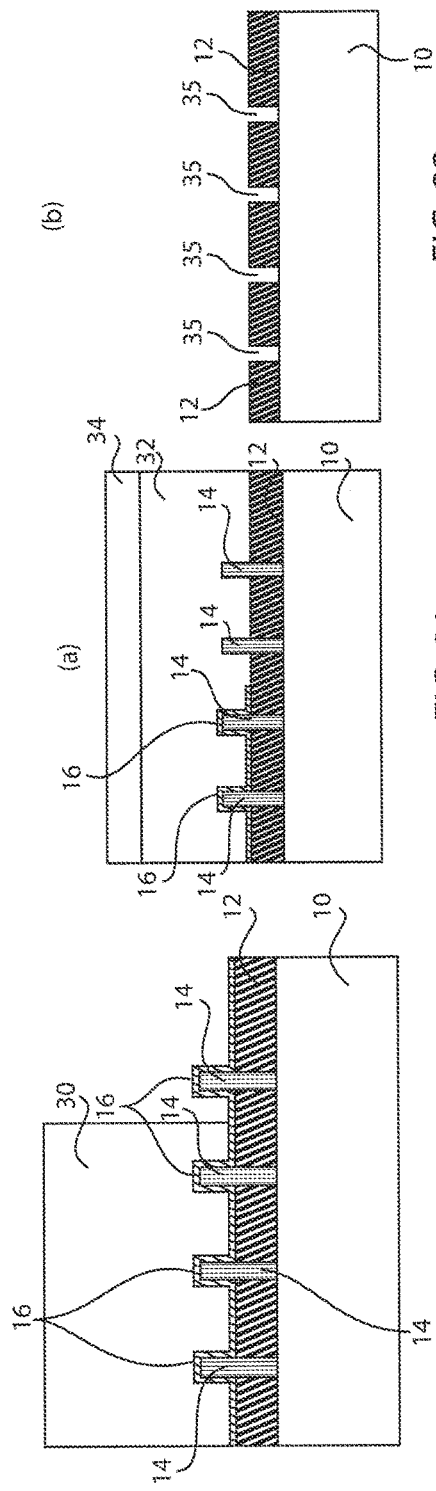

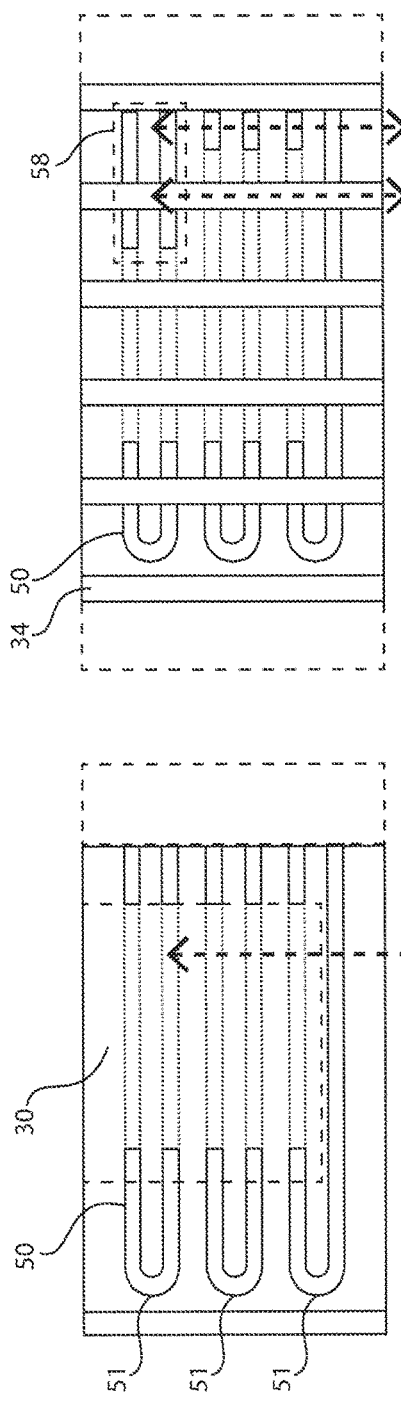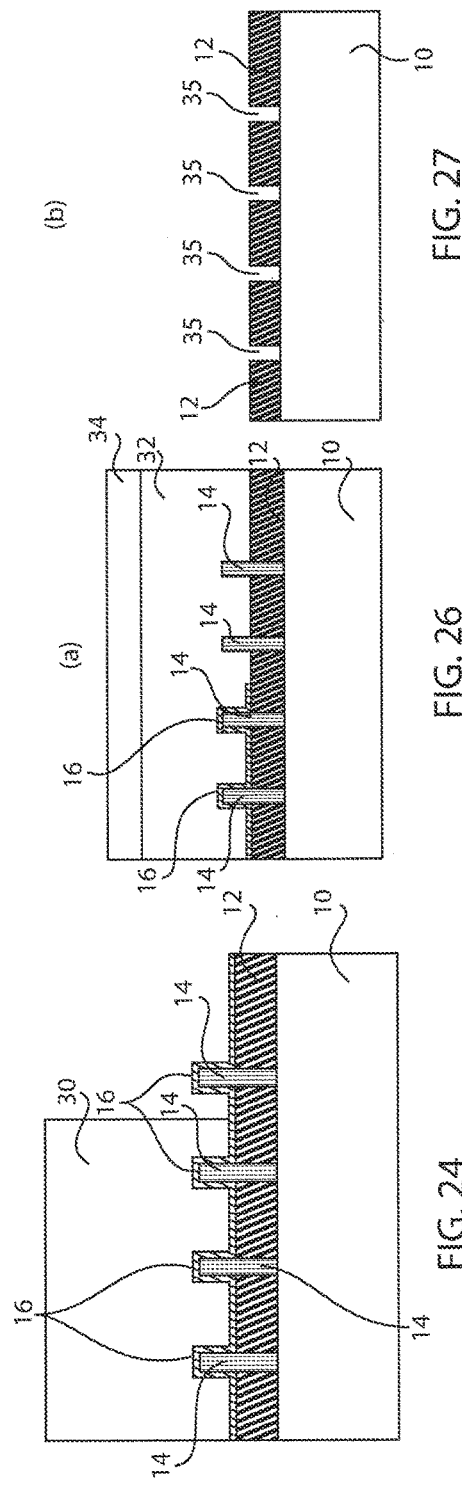

FIN CUT DURING REPLACEMENT GATE FORMATION

BACKGROUND

Technical Field

The present invention relates generally to semiconductor devices, and more specifically, to FinFET devices where fins are cut during replacement gate formation.

Description of the Related Art

A fin metal-oxide-semiconductor field effect transistor (finMOSFET or FinFET) can provide solutions to metal-oxide-semiconductor field effect transistor (MOSFET) scaling issues at and below, for example, the 22 nanometer (nm) node of semiconductor technology. A FinFET includes at least one narrow semiconductor fin (e.g., less than 30 nm wide) gated on at least two opposing sides of each of the at least one semiconductor fin. FinFET structures can, for example, typically be formed on either a semiconductor-on-insulator (SOI) substrate or a bulk semiconductor substrate.

A feature of a FinFET is a gate electrode located on at least two sides of the channel formed along the longitudinal direction of the fin. Due to the advantageous feature of full depletion in the fin structure, the increased number of sides (e.g., two or three) on which the gate electrode controls the channel of the FinFET enhances the controllability of the channel in a FinFET compared to a planar MOSFET. The improved control of the channel, among other things, allows smaller device dimensions with less short channel effects as well as larger electrical current that can be switched at high speeds.

SUMMARY

In accordance with an embodiment, a method is provided for forming a semiconductor structure. The method includes forming a plurality of vertical fins over a semiconductor layer formed over a substrate, depositing an oxide over the plurality of fins, applying a cutting mask over a portion of the plurality of fins, removing the oxide from the exposed portion of the plurality of fins, depositing a replacement gate stack, and etching portions of the replacement gate stack to remove exposed fins, the exposed fins forming recesses within the semiconductor layer.

In accordance with another embodiment, a semiconductor device is provided. The semiconductor device includes a plurality of vertical fins formed over a semiconductor layer formed over a substrate, an oxide deposited over the plurality of fins, a cutting mask applied over a portion of the plurality of fins, where the oxide is removed from the exposed portion of the plurality of fins, and a replacement gate stack, wherein portions of the replacement gate stack are etched to remove exposed fins, the exposed fins forming recesses within the semiconductor layer.

It should be noted that the exemplary embodiments are described with reference to different subject-matters. In particular, some embodiments are described with reference to method type claims whereas other embodiments have been described with reference to apparatus type claims. However, a person skilled in the art will gather from the above and the following description that, unless otherwise notified, in addition to any combination of features belonging to one type of subject-matter, also any combination between features relating to different subject-matters, in particular, between features of the method type claims, and features of the apparatus type claims, is considered as to be described within this document.

These and other features and advantages will become apparent from the following detailed description of illustrative embodiments thereof, which is to be read in connection with the accompanying drawings.

BRIEF DESCRIPTION OF THE SEVERAL VIEWS OF THE DRAWINGS

The invention will provide details in the following description of preferred embodiments with reference to the following figures wherein:

FIG. 10 is a cross-sectional view of the semiconductor device of FIG. 7 where a spacer is deposited, the cross sectional view taken along cut (a) shown in FIG. 13, in accordance with an embodiment of the present invention;

FIG. 11 is a cross-sectional view of the semiconductor device of FIG. 7 where a spacer is deposited, the cross sectional view taken along cut (b) shown in FIG. 13, in accordance with an embodiment of the present invention;

FIG. 12 is a cross-sectional view of the semiconductor device of FIG. 7 where a spacer is deposited, the cross sectional view taken along cut (c) shown in FIG. 13, in accordance with an embodiment of the present invention;

FIG. 13 is a top view of the semiconductor device of FIGS. 10-12, in accordance with an embodiment of the present invention;

FIG. 14 is a cross-sectional view of another semiconductor device, where a cutting mask is deposited over a portion of the plurality of fins to block the active fin arrays, in accordance with another embodiment of the present invention;

FIG. 15 is a top view of the semiconductor device of FIG. 14, in accordance with an embodiment of the present invention;

FIG. 16 is a cross-sectional view of the semiconductor device of FIG. 14 where a replacement gate stack of amorphous silicon and a hard mask layer are deposited over the plurality of fins. The replacement gate stack is then patterned using a lithography and sidewall-image-transfer etch process. The final replacement gate structures are formed after an anisotropic reactive ion etch (RIE) process the cross sectional view taken along cut (a) shown in FIG. 18, in accordance with an embodiment of the present invention;

FIG. 17 is a cross-sectional view of the semiconductor device of FIG. 14, after the final replacement gate etching process where exposed fins without oxide coating are etched down to the substrate, the cross-sectional view taken along cut (b) shown in FIG. 18, in accordance with an embodiment of the present invention;

FIG. 18 is a top view of the semiconductor device of FIGS. 16 and 17, in accordance with an embodiment of the present invention;

FIG. 19 is a cross-sectional view of another semiconductor device, where a cutting mask is deposited over a portion of the plurality of fins to expose the fin ends to be cut, in accordance with another embodiment of the present invention;

FIG. 20 is a top view of the semiconductor device of FIG. 19, in accordance with an embodiment of the present invention;

FIG. 21 is a cross-sectional view of the semiconductor device of FIG. 19 where a replacement gate stack of amorphous silicon and a hard mask layer are deposited over the plurality of fins. The replacement gate stack is then patterned using a lithography and sidewall-image-transfer etch process. The final replacement gate structures are formed after an anisotropic reactive ion etch (RIE) process, the cross sectional view taken along cut (a) shown in FIG. 23, in accordance with an embodiment of the present invention;

FIG. 22 is a cross-sectional view of the semiconductor device of FIG. 14 after the final replacement gate etching process where exposed fins without oxide coating are etched down to the substrate, the cross-sectional view taken along cut (b) shown in FIG. 23, in accordance with an embodiment of the present invention;

FIG. 23 is a top view of the semiconductor device of FIGS. 21 and 22, in accordance with an embodiment of the present invention;

FIG. 24 is a cross-sectional view of another semiconductor device, where a cutting mask is deposited over a portion of the plurality of fins to form a tapered device, in accordance with another embodiment of the present invention;

FIG. 25 is a top view of the semiconductor device of FIG. 24, in accordance with an embodiment of the present invention;

FIG. 26 is a cross-sectional view of the semiconductor device of FIG. 24 where a replacement gate stack of amorphous silicon and a hard mask layer are deposited over the plurality of fins. The replacement gate stack is then patterned using a lithography and sidewall-image-transfer etch process. The final replacement gate structures are formed after an anisotropic reactive ion etch (RIE) process, the cross sectional view taken along cut (a) shown in FIG. 28, in accordance with an embodiment of the present invention;

FIG. 27 is a cross-sectional view of the semiconductor device of FIG. 24, after the final replacement gate etching process where exposed fins without oxide coating are etched down to the substrate, the cross sectional view taken along cut (b) shown in FIG. 28, in accordance with an embodiment of the present invention;

FIG. 28 is a top view of the semiconductor device of FIGS. 26 and 27, in accordance with an embodiment of the present invention.

Throughout the drawings, same or similar reference numerals represent the same or similar elements.

DETAILED DESCRIPTION

Figure 2:
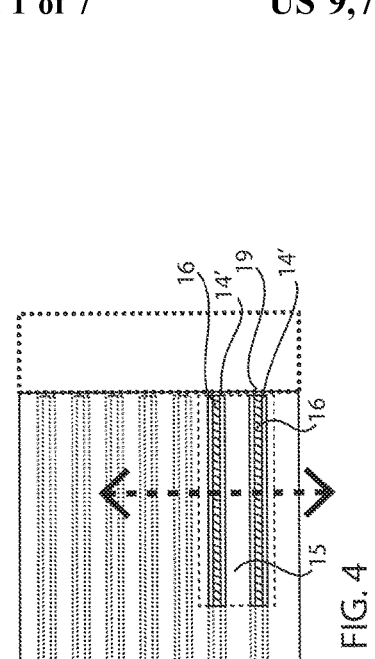
FIG. 2 is a top view of the semiconductor structure of FIG. 1, in accordance with an embodiment of the present invention.

In one or more embodiments, a method includes forming a plurality of vertical fins over a semiconductor layer formed over a substrate, depositing an oxide over the plurality of fins, applying a cutting mask over a portion of the plurality of fins, removing the oxide from the exposed portion of the plurality of fins, depositing a replacement gate stack, and etching portions of the replacement gate stack to remove exposed fins, the exposed fins forming recesses within the semiconductor layer.

In one or more embodiments, a semiconductor structure includes a plurality of vertical fins formed over a semiconductor layer formed over a substrate, an oxide deposited over the plurality of fins, a cutting mask applied over a portion of the plurality of fins, where the oxide is removed from the exposed portion of the plurality of fins, and a replacement gate stack, wherein portions of the replacement gate stack are etched to remove exposed fins, the exposed fins forming recesses within the semiconductor layer.

In one or more embodiments, the methods simplify the fin cut process by not cutting the fins until the final replacement gate reactive ion etching (RIE) process. The protecting replacement dummy gate oxide is removed in areas to be cut, so that the Si gate etch also etches the exposed fin structures. This eliminates the dense/iso loading issue since the density of the process is defined by the gate etch process and not just the fin cut mask. The material deposited over the fins (e.g., replacement dummy gate oxide and gate amorphous silicon) also pins the fins so that strain relaxation is inhibited.

In one or more embodiments, the fins are cut during the gate etch. The gates are not cut in the present invention. Instead, the gates are etched and the fins are cut. Stated differently, the present invention utilizes a cut mask pattern assembly to allow for the cutting of fins with the replacement gate etch process.

Aspects of the present invention relate to methods of semiconductor manufacturing, and more particular aspects relate to methods of thinning and cutting fins from among arrays of fins on a substrate in order to prepare them for inclusion in FinFETs in an integrated circuit. The process of forming FinFETs can be performed by producing large numbers of fins for inclusion in FinFETs. Forming large numbers of fins at once can simplify the manufacturing process and can result in FinFETs with more uniform fins. While the present invention is not necessarily limited to such applications, various aspects of the invention can be appreciated through a discussion of various examples using this context.

During semiconductor manufacturing, fin field effect transistors (FinFETs) can be formed out of a large fin array on a semiconductor substrate. A fin array can include many parallel fins from a layer of fin material in a single step before subsequent processing divides (cuts) the fins into groups or sections. Rather than cutting target fins and target fin segments (hereinafter, target fins) by etching them away, one can cut fins by oxidizing the fin material of the target fins and converting the target fins into nonconductive dielectric fins. Cutting target fins can eliminate a conductive top part of the target fin (some of the fin, or all of the fin) so that no semiconducting part of the target fin can connect with the FinFET gate when the FinFET is complete.

Fins in a fin array can have one or more fin lengths and fin widths, and a variety of fin pitches, as well. Across a single semiconductor wafer, fins with various lengths, widths, and pitches can be processed (cut) simultaneously during a fin cut process, or can be cut in sequential steps according to embodiments of integrated circuit manufacturing flows. Groups and sections of fins left behind after cutting can be incorporated into FinFETs according to integrated circuit designs. The process of cutting fins can be performed to remove long segments of some fins, or to transect shorter segments across a number of other adjacent fins, in order to achieve the desired final fin layout for the integrated circuit. According to embodiments, fin arrays with a fin pitch of 40 nm or less between fins can undergo fin cutting by oxidizing semiconductor fins to create FinFETs. Some embodiments can have a fin pitch of approximately 20 nm between fins that are cut from a fin array. Embodiments with narrow fins can have fin pitches as small as 10 nm, according to aspects of the present invention.

Creating fins in a fin array can include steps of depositing a hard mask made of an oxide such as silicon dioxide or a nitride such as silicon nitride on a layer of fin material, creating a fin pattern in the hard mask, and etching the layer of fin material in order to expose the substrate beneath the fins. Fin materials can include silicon, doped silicon, silicon germanium alloys, and doped silicon germanium alloys, as well as other materials that can be formed into field effect transistors.

Embodiments of the present invention can include methods that leave the hard mask on top of the semiconductor fins in the fin array after the fins are etched and before a conformal liner is deposited on top of the semiconductor fins. Some embodiments can include methods that remove the hard mask before the conformal liner is deposited onto the semiconductor fins. The hard mask is generally a sacrificial material in the film stack, removed before gate material is deposited onto the semiconductor fins. Embodiments of the present invention can describe processing the wafer with and without the hard mask present. Such discussions should not be construed as limiting the scope of the present invention.

The semiconductor fins in the fin array can be cut in order to eliminate some fins (or parts of some fins) to leave a pattern of active fins behind. Active fins generally protrude above the top of a fill material deposited into troughs between fins in the fin array. Cutting target fins in a fin array, such that no part of a target fin protrudes above the top of the fill material in the troughs, can include oxidizing target fins in situ rather than physically removing target fin material by etching down to or into the substrate.

Oxidizing target fins can include oxidizing a top portion of a target fin, or can include oxidizing all of a target fin, according to embodiments. By converting the material of target fins into a nonconductive dielectric material, any semiconducting portion of a target fin can be encapsulated by the fill material deposited between fins and by the dielectric material (dielectric fin) that can remain on top of any semiconducting portion of a target fin. Further, by converting target semiconductor fins into dielectric fins or dielectric material, it is possible to reduce the height of the oxidized target fins through a chemical etching process rather than a plasma etching process if so desired. Cutting semiconductor fins by plasma etching can modify the slope of fin sides adjacent to the target fins, influencing their electrical properties. In some embodiments, wet chemical etching can be more uniform and more selective between materials than plasma etching, preserving fin material and fin profile during the cutting process.

As used herein, "semiconductor device" refers to an intrinsic semiconductor material that has been doped, that is, into which a doping agent has been introduced, giving it different electrical properties than the intrinsic semiconductor. Doping involves adding dopant atoms to an intrinsic semiconductor, which changes the electron and hole carrier concentrations of the intrinsic semiconductor at thermal equilibrium. Dominant carrier concentration in an extrinsic semiconductor determines the conductivity type of the semiconductor.

As used herein, the term "drain" means a doped region in the semiconductor device located at the end of the channel, in which carriers are flowing out of the transistor through the drain.

As used herein, the term "source" is a doped region in the semiconductor device, in which majority carriers are flowing into the channel.

The term "direct contact" or "directly on" means that a first element, such as a first structure, and a second element, such as a second structure, are connected without any intermediary conducting, insulating or semiconductor layers at the interface of the two elements.

The terms "overlying", "atop", "positioned on" or "positioned atop" means that a first element, such as a first structure, is present on a second element, such as a second structure, wherein intervening elements, such as an interface structure can be present between the first element and the second element.

The term "electrically connected" means either directly electrically connected, or indirectly electrically connected, such that intervening elements are present; in an indirect electrical connection, the intervening elements can include inductors and/or transformers.

The term "crystalline material" means any material that is single-crystalline, multi-crystalline, or polycrystalline.

The term "non-crystalline material" means any material that is not crystalline; including any material that is amorphous, nano-crystalline, or micro-crystalline.

The term "intrinsic material" means a semiconductor material which is substantially free of doping atoms, or in which the concentration of dopant atoms is less than $10^{15}$ atoms/cm$^3$.

As used herein, "p-type" refers to the addition of impurities to an intrinsic semiconductor that creates deficiencies of valence electrons. In a silicon-containing substrate, examples of n-type dopants, i.e., impurities, include but are not limited to: boron, aluminum, gallium and indium.

As used herein, "n-type" refers to the addition of impurities that contributes free electrons to an intrinsic semiconductor. In a silicon containing substrate examples of n-type dopants, i.e., impurities, include but are not limited to antimony, arsenic and phosphorous.

As used herein, an "anisotropic etch process" denotes a material removal process in which the etch rate in the direction normal to the surface to be etched is greater than in the direction parallel to the surface to be etched. The anisotropic etch can include reactive-ion etching (RIE). Other examples of anisotropic etching that can be used at this point of the present invention include ion beam etching, plasma etching or laser ablation.

As used herein, the term "fin structure" refers to a semiconductor material, which can be employed as the body of a semiconductor device, in which a gate structure is positioned around the fin structure such that charge flows down the channel on the two sidewalls of the fin structure and optionally along the top surface of the fin structure. The fin structures are processed to provide FinFETs. A field effect transistor (FET) is a semiconductor device in which output current, i.e., source-drain current, is controlled by the voltage applied to the gate structure to the channel of a semiconductor device. A finFET is a semiconductor device that positions the channel region of the semiconductor device in a fin structure.

It is to be understood that the present invention will be described in terms of a given illustrative architecture; however, other architectures, structures, substrate materials and process features and steps/blocks may be varied within the scope of the present invention. It should be noted that certain features may not be shown in all figures for the sake of clarity. This is not intended to be interpreted as a limitation of any particular embodiment, or illustration, or scope of the claims.

Figure 1:
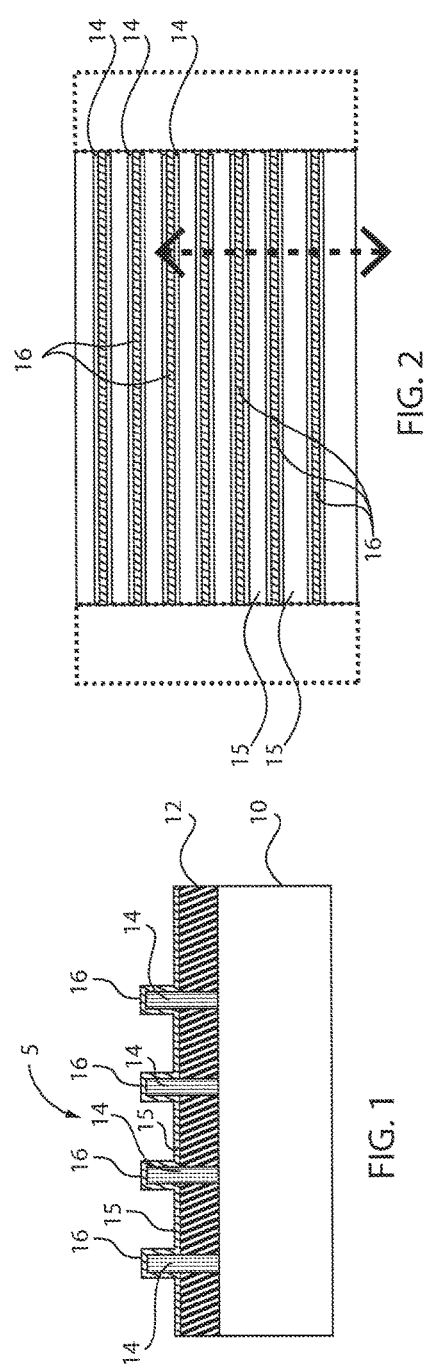
FIG. 1 is a cross-sectional view of a semiconductor structure including a plurality of vertical fins over a substrate, each fin coated with an oxide, in accordance with an embodiment of the present invention.

FIG. 1 is a cross-sectional view of a semiconductor structure including a plurality of vertical fins over a substrate, each fin coated with an oxide, in accordance with an embodiment of the present invention.

A semiconductor structure 5 includes a semiconductor substrate 10 with a plurality of fins 14, where the fins are separated by a local isolation dielectric fill layer 12. The dielectric layer 12 can be, e.g., $SiO_2$. In one embodiment, a proximal portion of the fins 14 extends into the local isolation dielectric layer 12. The fins 14 extend vertically from the substrate 10. Stated differently, the fins 14 are normal to or perpendicular to the substrate 10. A sacrificial oxide layer 16 is deposited on the fins 14. The oxide layer 16 encompasses or envelops the fins 14. The oxide layer contacting the top portion of the fins 14 can be designated as 16 and the oxide layer contacting regions or troughs between the fins 14 can be designated as 15.

In one or more embodiments, the substrate 10 can be a semiconductor or an insulator with an active surface semiconductor layer. The substrate 10 can be crystalline, semi-crystalline, microcrystalline, or amorphous. The substrate 10 can be essentially (i.e., except for contaminants) a single element (e.g., silicon), primarily (i.e., with doping) of a single element, for example, silicon (Si) or germanium (Ge), or the substrate 10 can include a compound, for example, $Al_2O_3$, $SiO_2$, GaAs, SiC, or SiGe. The substrate 10 can also have multiple material layers, for example, a semiconductor-on-insulator substrate (SeOI), a silicon-on-insulator substrate (SOI), germanium-on-insulator substrate (GeOI), or silicon-germanium-on-insulator substrate (SGOI). The substrate 10 can also have other layers forming the substrate 10, including high-k oxides and/or nitrides. In one or more embodiments, the substrate 10 can be a silicon wafer. In an embodiment, the substrate 10 is a single crystal silicon wafer.

As used herein, a "semiconductor fin" refers to a semiconductor structure including a portion having a shape of a rectangular parallelepiped. The direction along which a semiconductor fin 14 laterally extends the most is herein referred to as a "lengthwise direction" of the semiconductor fin 14. The height of each semiconductor fin 14 can be in a range from 5 nm to 300 nm, although lesser and greater heights can also be employed. The width of each semiconductor fin 14 can be in a range from 5 nm to 100 nm, although lesser and greater widths can also be employed. In various embodiments, the fins 14 can have a width in the range of about 6 nm to about 20 nm, or can have a width in the range of about 8 nm to about 15 nm, or in the range of about 10 nm to about 12 nm. In various embodiments, the fins 14 can have a height in the range of about 25 nm to about 75 nm, or in the range of about 40 nm to about 50 nm.

Multiple semiconductor fins 14 can be arranged such that the multiple semiconductor fins 14 have the same lengthwise direction, and are laterally spaced from each other along a horizontal direction that is perpendicular to the lengthwise direction. In this case, the horizontal direction that is perpendicular to the common lengthwise direction is referred to as a "widthwise direction." Each semiconductor fin 14 includes a pair of parallel sidewalls along the lengthwise direction and a pair of 14.

In one embodiment, each semiconductor fin 14 can be formed by lithography and etching. The lithographic step can include forming a photoresist (not shown) atop a substrate including a topmost semiconductor material, exposing the photoresist to a desired pattern of radiation and then developing the exposed photoresist utilizing a conventional resist developer. The pattern within the photoresist is then transferred into the topmost semiconductor material. The etch can include a dry etch process, a chemical wet etch process, or any combination thereof. When a dry etch is used, the dry etch can be a reactive ion etch process, a plasma etch process, ion beam etching or laser ablation. The patterned photoresist material can be removed after transferring the pattern utilizing a conventional stripping process.

In another embodiment of the present application, each semiconductor fin 14 can be formed utilizing a SIT (sidewall image transfer) process. In a typical SIT process, spacers are formed on sidewall surface of a sacrificial mandrel that is formed on a topmost semiconductor material of a substrate. The sacrificial mandrel is removed and the remaining spacers are used as a hard mask to etch the topmost semiconductor material of the substrate. The spacers are then removed after each semiconductor fin 14 has been formed. In another embodiment, sequential SIT processes can be utilized to form fins with highly scaled fin width and pitches.

In some embodiments, the fins in the plurality of semiconductor fins can have a fin width between 5 nm and 10 nm. The combination of the fin width and the width of the trough equals, in embodiments, the fin pitch. The fin width and the fin pitch can vary in different areas of a fin array, and can vary from one fin array to another on a semiconductor wafer, according to the design parameters of the integrated circuit that is being made. For example, fins of negatively doped FinFETs can have a different fin size than positively doped FinFETs because of the electrical properties of the materials they are made of.

In various embodiments, the oxide layer 16 can be silicon oxide (e.g., $SiO_2$) or a silicon oxide/silicon borocarbonitride (SiBCN) bilayer, which can be formed by chemical vapor deposition (CVD), ALD, or a combination thereof. The silicon oxide of the bilayer can be directly on the vertical sides of the fins 14, and the SiBCN can be formed on the silicon oxide. In various embodiments, the portion of the oxide layer 16 can be removed by chemical-mechanical polishing (CMP) and/or etching.

FIG. 2 is a top view of the semiconductor structure of FIG. 1, in accordance with an embodiment of the present invention.

The top view illustrates the fins 14. The top view also illustrates the oxide layer 16 covering the top portion of the fins 14 and the oxide layer 15 covering regions or troughs between the fins 14.

Figure 3:
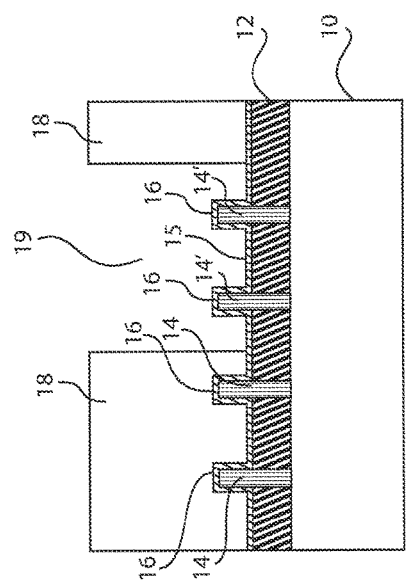
FIG. 3 is a cross-sectional view of the semiconductor device of FIG. 1 where a cutting mask is placed over the plurality of fins, in accordance with an embodiment of the present invention.

FIG. 3 is a cross-sectional view of the semiconductor device of FIG. 1 where a cutting mask is placed over the plurality of fins, in accordance with an embodiment of the present invention.

In various embodiments, a cutting mask 18 is placed over a portion of the fins 14. In one example, the cutting mask 18 is an organic planarization layer (OPL). The OPL 18 can be formed utilizing a deposition process such as, for example, spin-on, CVD, PECVD, evaporation, chemical solution deposition and other like deposition techniques.

The thickness of the OPL 18 can vary so long as its thickness is greater than the total thickness of each gate line and of the plurality of gate lines (not shown). In one embodiment, the OPL 18 has a thickness from 50 nm to 500 nm. In another embodiment, the OPL 18 has a thickness from 150 nm to 300 nm.

The cutting mask 18 provides robust removal of extraneous (or, undesired) features added to the first exposure's mask layout. It is understood that as used herein, the terms "extraneous features" and "undesired features" can be used interchangeably to describe features produced in a layout (e.g., due to printing) that are not desirable in the final layout, and also violate certain dimensional constraints (e.g., tolerances). In some cases, these extraneous features can be identified during simulation, prior to formation of the cutting mask 18. In some cases, these extraneous features can exist at the outer contour of a process variation band (e.g., those outermost process variations). In some cases, these extraneous features can exist due to exposure variations and/or interfering light waveforms (e.g., via constructive interference) that create undesired features (e.g., features) on an underlying target. The cutting mask 18 can then be designed in order to remove these extraneous features from the final layout.

The fins not covered by the OPL 18 are designated as fins 14'. The fins 14' are the fins that will be subsequently cut during the replacement gate etching process described below. The fins 14' can also be designated as target fins. The fins 14' can reside in a region 19 not covered by the OPL 18, as described below.

Figure 4:
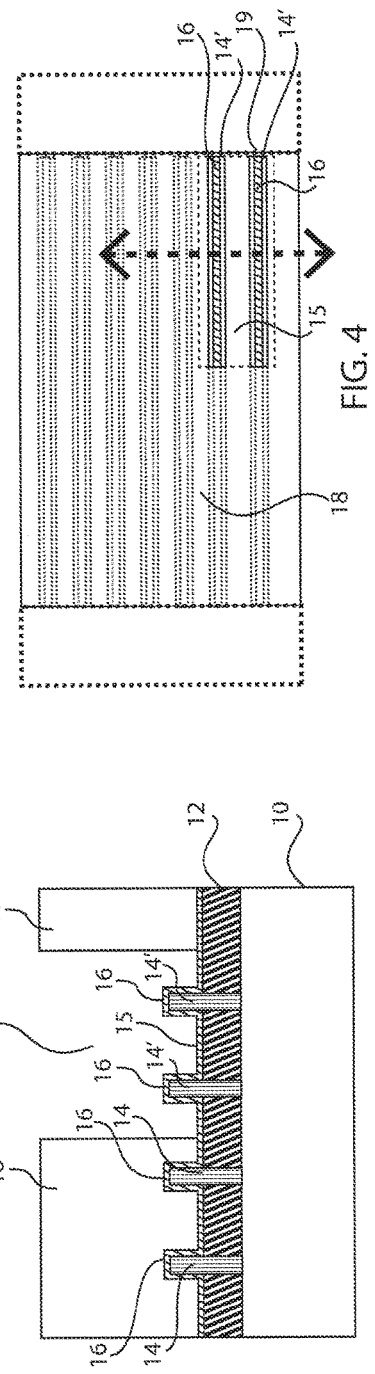
FIG. 4 is a top view of the semiconductor device of FIG. 3, in accordance with an embodiment of the present invention.

FIG. 4 is a top view of the semiconductor device of FIG. 3, in accordance with an embodiment of the present invention.

The top view illustrates the region 19 that is not covered by the OPL 18. In region 19, the fins 14' covered by the oxide layer 16 are exposed. Additionally, some regions or troughs between the fins 14' covered by oxide layer 15 are also exposed. The region 19 represents the region where fins 14' will be subsequently cut during the gate etching process described below.

Figure 5:
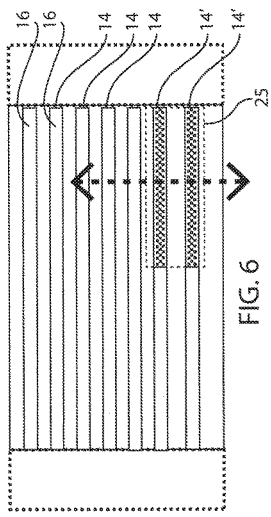
FIG. 5 is a cross-sectional view of the semiconductor device of FIG. 3 where the oxide is selectively removed from a portion of the plurality of fins, in accordance with an embodiment of the present invention.

FIG. 5 is a cross-sectional view of the semiconductor device of FIG. 3 where the oxide is selectively removed from a portion of the plurality of fins, in accordance with an embodiment of the present invention.

In various embodiments, the OPL 18 and the exposed oxide 15, 16 are etched. The etching can include a dry etching process such as, for example, reactive ion etching, plasma etching, ion etching or laser ablation. The etching can further include a wet chemical etching process in which one or more chemical etchants are used to remove portions of the blanket layers that are not protected by the patterned photoresist. The patterned photoresist can be removed utilizing an ashing process.

The etching results in exposing fins 14' without any oxide thereon or therebetween. The etching also results in exposing the oxide layers 15, 16 of the fins 14 that were covered by the OPL 18.

As used herein, the term "selective" in reference to a material removal process denotes that the rate of material removal for a first material is greater than the rate of removal for at least another material of the structure to which the material removal process is being applied. For example, in one embodiment, a selective etch can include an etch chemistry that removes a first material selectively to a second material by a ratio of 10:1 or greater, e.g., 100:1 or greater, or 1000:1 or greater.

Figure 6:
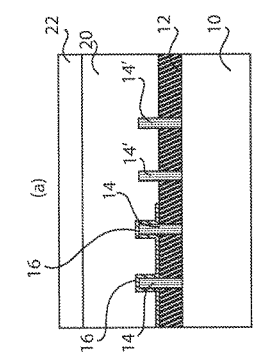
FIG. 6 is a top view of the semiconductor device of FIG. 5, in accordance with an embodiment of the present invention.

FIG. 6 is a top view of the semiconductor device of FIG. 5, in accordance with an embodiment of the present invention.

The top view illustrates region 25 exposing the fins 14'. The top view also illustrates the fins 14 covered by the oxide layers 15, 16.

Figure 7:
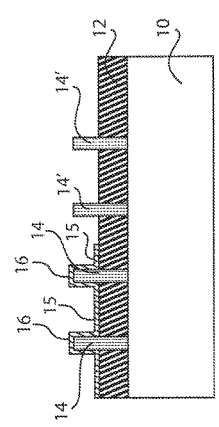
FIG. 7 is a cross-sectional view of the semiconductor device of FIG. 5 where a replacement gate stack of amorphous silicon and a hard mask layer are deposited over the plurality of fins. The replacement gate stack is then patterned using a lithography and sidewall-image-transfer etch process. The final replacement gate structures are formed after an anisotropic reactive ion etch (RIE) process, the cross-sectional view along the replacement gate taken along cut (a) shown in FIG. 9, in accordance with an embodiment of the present invention.

FIG. 7 is a cross-sectional view of the semiconductor device of FIG. 5 where a replacement gate stack of amorphous silicon and a hard mask layer are deposited over the plurality of fins. The replacement gate stack is then patterned using a lithography and sidewall-image-transfer etch process. The final replacement gate structures are formed after an anisotropic reactive ion etch (RIE) process, the cross-sectional view along the replacement gate taken along cut (a) shown in FIG. 9, in accordance with an embodiment of the present invention.

In various embodiments, a dummy gate 20 and a hard mark 22 are deposited over the structure of FIG. 5. The dummy gate 20 can be, e.g., amorphous Si. The dummy gate 20 covers the fins 14 (having the oxide layer 16) and also covers the fins 14' (that are exposed; not covered by oxide layers). A hard mask 22 is then deposited over the dummy gate 20.

The block masks can comprise soft and/or hard mask materials and can be formed using deposition, photolithography and etching. In one embodiment, the block mask comprises a photoresist. A photoresist block mask can be produced by applying a photoresist layer, exposing the photoresist layer to a pattern of radiation, and then developing the pattern into the photoresist layer utilizing conventional resist developer. Typically, the block masks have a thickness ranging from 100 nm to 300 nm.

The block mask can comprise soft and/or hard mask materials and can be formed using deposition, photolithography and etching. In one embodiment, the block mask is a hard mask composed of a nitride-containing material, such as silicon nitride. It is noted that it is not intended that the block mask be limited to only silicon nitride, as the composition of the hard mask can include any dielectric material that can be deposited by chemical vapor deposition (CVD) and related methods. Other hard mask compositions for the block mask can include silicon oxides, silicon oxynitrides, silicon carbides, silicon carbonitrides, etc. Spin-on dielectrics can also be utilized as a hard mask material including, but not limited to: silsesquioxanes, siloxanes, and boron phosphate silicate glass (BPSG).

In one embodiment, a block mask comprising a hard mask material can be formed by blanket depositing a layer of hard mask material, providing a patterned photoresist atop the layer of hard mask material, and then etching the layer of hard mask material to provide a block mask protecting at least one portion of the dummy gate 20. A patterned photoresist can be produced by applying a blanket photoresist layer to the surface of the dummy gate 20, exposing the photoresist layer to a pattern of radiation, and then developing the pattern into the photoresist layer utilizing resist developer. Etching of the exposed portion of the block mask can include an etch chemistry for removing the exposed portion of the hard mask material and having a high selectivity to at least the block mask. In one embodiment, the etch process can be an anisotropic etch process, such as reactive ion etch (RIE). In another embodiment, the replacement gate can be formed by utilizing the SIT patterning and etching process described above.

Figure 8:
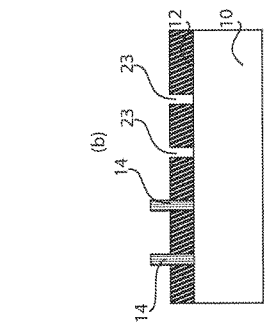
FIG. 8 is a cross-sectional view of the semiconductor device of FIG. 5, after the final replacement gate etching process where exposed fins without oxide coating are etched down to the substrate and fins coated with oxide are preserved, the cross-sectional view across the fins, between replacement gates taken along cut (b) shown in FIG. 9, in accordance with an embodiment of the present invention.
Figure 9:
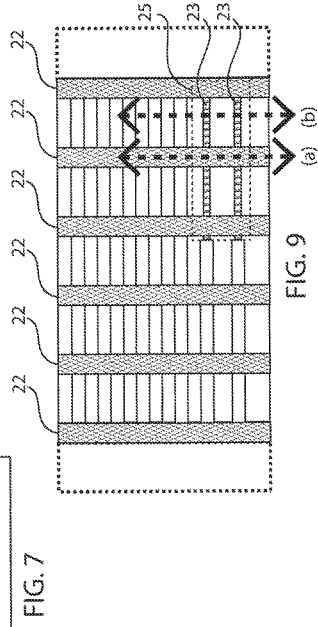
FIG. 9 is a top view of the semiconductor device of FIGS. 7 and 8, in accordance with an embodiment of the present invention.

FIG. 8 is a cross-sectional view of the semiconductor device of FIG. 5, after the final replacement gate etching process where exposed fins without oxide coating are etched down to the substrate and fins coated with oxide are preserved, the cross-sectional view across the fins, between replacement gates taken along cut (b) shown in FIG. 9, in accordance with an embodiment of the present invention.

The dummy gate 20 is planarized (via, e.g., CMP) and etched back to be removed. The dummy gate 20 has a thickness that is greater than the thickness of the fins 14. The dummy gate 20 can also have a thickness that is greater than the thickness of the gate hard mask 22.

The dummy gate silicon etching further results in the removal of the exposed fins 14' (FIG. 5) and a subsequent post RIE wet clean (e.g., dilute HF) results in the selective removal of the oxide layer 16 from fins 14. The removal of the exposed fins 14' results in gaps or cavities or recesses 23 formed between portions of the local isolation dielectric fill between fins. Therefore, the fins 14' are cut during the etching of the gate structure 20. The etching can be, e.g., an RIE etch. Therefore, after the gate structure 20 is etched, an oxidation process is performed that oxidizes the sidewall of the gate, the sidewall of the fin cut, and the top surface of the exposed substrate. A breakthrough etch can be used to remove the top surface of the oxidized substrate and a long Si etch can be performed to increase a depth of the fin cut into the substrate. The protective layer around the fin can be removed by etching or by WETs (e.g. dilute HF for SiO2). The fins 14' can also be oxidized, instead of using the over-etching RIE process. This can turn the fin 14' within the cut region into an insulator.

RIE is a form of plasma etching in which during etching the surface to be etched is placed on the RF powered electrode. Moreover, during RIE the surface to be etched takes on a potential that accelerates the etching species extracted from plasma toward the surface, in which the chemical etching reaction is taking place in the direction normal to the surface. Other examples of anisotropic etching that can be used at this point of the present invention include ion beam etching, plasma etching or laser ablation.

In various embodiments, the materials and layers can be deposited by physical vapor deposition (PVD), chemical vapor deposition (CVD), atomic layer deposition (ALD), molecular beam epitaxy (MBE), or any of the various modifications thereof, for example plasma-enhanced chemical vapor deposition (PECVD), metal-organic chemical vapor deposition (MOCVD), low pressure chemical vapor deposition (LPCVD), electron-beam physical vapor deposition (EB-PVD), and plasma-enhanced atomic layer deposition (PE-ALD). The depositions can be epitaxial processes, and the deposited material can be crystalline. In various embodiments, formation of a layer can be by one or more deposition processes, where, for example, a conformal layer can be formed by a first process (e.g., ALD, PE-ALD, etc.) and a fill can be formed by a second process (e.g., CVD, electrodeposition, PVD, etc.).

FIG. 9 is a top view of the semiconductor device of FIGS. 7 and 8, in accordance with an embodiment of the present invention.

The top view illustrates region 25 where the gaps or cavities or recesses 23 are exposed. The top view also illustrates the hard mask 22.

FIG. 10 is a cross-sectional view of the semiconductor device of FIG. 7 where a spacer is deposited, the cross sectional view taken along cut (a) shown in FIG. 13, in accordance with an embodiment of the present invention.

FIG. 11 is a cross-sectional view of the semiconductor device of FIG. 7 where a spacer is deposited, filling in the trenches created after the fin cut and coating the remaining standing fins between replacement gates, the cross sectional view taken along cut (b) shown in FIG. 13, in accordance with an embodiment of the present invention.

FIG. 12 is a cross-sectional view of the semiconductor device of FIG. 7 where a spacer is deposited, the cross sectional view taken along cut (c) shown in FIG. 13, in accordance with an embodiment of the present invention.

In various embodiments, a spacer fill takes place. A spacer etch back process can leave dielectric on the PC sidewall and in the fin cut trench, but is removed from the fins, which will have EPI growth. The spacer 24 can be, e.g., a nitride film. In an embodiment, the spacer can be an oxide, for example, silicon oxide (SiO), a nitride, for example, a silicon nitride (SiN), or an oxynitride, for example, silicon oxynitride (SiON). In an embodiment, the spacer 24 can be, e.g., SiOCN, SiBCN, or similar film types. The spacer 24 can also be referred to as a non-conducting dielectric layer.

In some exemplary embodiments, the spacer 24 can include a material that is resistant to some etching processes such as, for example, HF chemical etching or chemical oxide removal etching. For illustrative purposes, the spacer 24 is shown as a single layer of material. Exemplary embodiments of the spacer 24 can include, for example, multiple layers of similar or dissimilar materials that may be disposed in horizontally or vertically arranged layers relative to the substrate 10 by any suitable material deposition process.

In one or more embodiments, the spacer 24 can have a thickness in the range of about 3 nm to about 10 nm, or in the range of about 3 nm to about 5 nm. Spacer thickness is selected based on a desire to pinch-off the trench within the recessed region 23 while having a suitable thickness for device performance.

FIG. 13 is a top view of the semiconductor device of FIGS. 10-12, in accordance with an embodiment of the present invention.

The top view illustrates the spacer 24 atop of the remaining fins 14 and the spacer 24 within the recesses 23 (FIG. 8) of the local isolation dielectric layer 12.

FIG. 14 is a cross-sectional view of another semiconductor device, where a cutting mask is deposited over a portion of the plurality of fins to block the active fin arrays, in accordance with another embodiment of the present invention.

Another way of cutting the fin is illustrated describing patterning an area of the fins that needs to be preserved within a macro. The term "macro" describes a designed FinFET structure. In FIG. 14, a cutting mask or OPL 30 is deposited atop of a portion of the fins 14.

FIG. 15 is a top view of the semiconductor device of FIG. 14, in accordance with an embodiment of the present invention.

In the top view, the OPL 30 is shown covering or masking a portion of the fins 14.

FIG. 16 is a cross-sectional view of the semiconductor device of FIG. 14 where a replacement gate stack of amorphous silicon and a hard mask layer are deposited over the plurality of fins. The replacement gate stack is then patterned using a lithography and sidewall-image-transfer etch process. The final replacement gate structures are formed after an anisotropic reactive ion etch (RIE) process the cross sectional view taken along cut (a) shown in FIG. 18, in accordance with an embodiment of the present invention.

In various embodiments, a dummy gate 32 and a hard mark 34 are deposited over the structure of FIG. 14. The dummy gate 32 can be, e.g., amorphous Si. The dummy gate 32 covers the fins 14 (having the oxide layer 16) and also covers the fins 14' (that are exposed; not covered by oxide layers). A hard mask 34 is then deposited over the dummy gate 32.

FIG. 17 is a cross-sectional view of the semiconductor device of FIG. 14, after the final replacement gate etching process where exposed fins without oxide coating are etched down to the substrate, the cross-sectional view taken along cut (b) shown in FIG. 18, in accordance with an embodiment of the present invention.

The dummy gate 32 is planarized (via, e.g., CMP) and etched back to be removed. The dummy gate silicon etching further results in the removal of the exposed fins 14' and a subsequent post RIE wet clean (e.g., dilute HF) results in the selective removal of the oxide layer 16 from fins 14. The removal of the exposed fins 14' results in gaps or cavities or recesses 35 formed between portions of the local isolation fill 12 between fins 14'. Therefore, the fins 14' are cut during the etching of the gate structure 32. The etching can be, e.g., an RIE etch.

FIG. 18 is a top view of the semiconductor device of FIGS. 16 and 17, in accordance with an embodiment of the present invention.

In the top view, the OPL 30 is shown covering or masking a portion of the fins 40.

FIG. 19 is a cross-sectional view of another semiconductor device, where a cutting mask is deposited over a portion of the plurality of fins to expose the fin ends to be cut, in accordance with another embodiment of the present invention.

FIGS. 19, 21, and 22 are similar to FIGS. 14, 16, and 17, respectively, and their description will be omitted for sake of clarity.

FIG. 20 is a top view of the semiconductor device of FIG. 14, in accordance with an embodiment of the present invention.

Another way of cutting the fin is illustrated describing how the looped ends of a sidewall image transfer or quadruple patterning process would proceed. The fin loops 40 include a distal end 41. The OLD 30 covers or masks a portion of the fin loops 40. The distal ends 41 remain exposed such that portions of the distal ends 41 can be removed to isolate each fin 40 from adjacent fins 40.

FIG. 23 is a top view of the semiconductor device of FIGS. 21 and 22, in accordance with an embodiment of the present invention.

The top view illustrates an exposed portion 48 of the fins 40.

FIGS. 24, 26, and 27 are similar to FIGS. 14, 16, and 17, respectively, and their description will be omitted for sake of clarity.

FIG. 25 is a top view of the semiconductor device of FIG. 24, in accordance with an embodiment of the present invention.

In the top view, the OPL 30 is shown covering or masking a portion of the fins 50.

Another way of cutting the fin is illustrated describing how one can make a macro where there are different fin lengths, some spanning 2 gates and some spanning 3 gates. The fin loops 50 include a distal end 51. The OLD 30 covers or masks a portion of the fin loops 50. The distal ends 51 remain exposed such that portions of the distal ends 51 can be removed to isolate each fin 50 from adjacent fins 50.

FIG. 28 is a top view of the semiconductor device of FIGS. 26 and 27, in accordance with an embodiment of the present invention.

The top view illustrates an exposed portion 58 of the fins 50.

Figure 29:
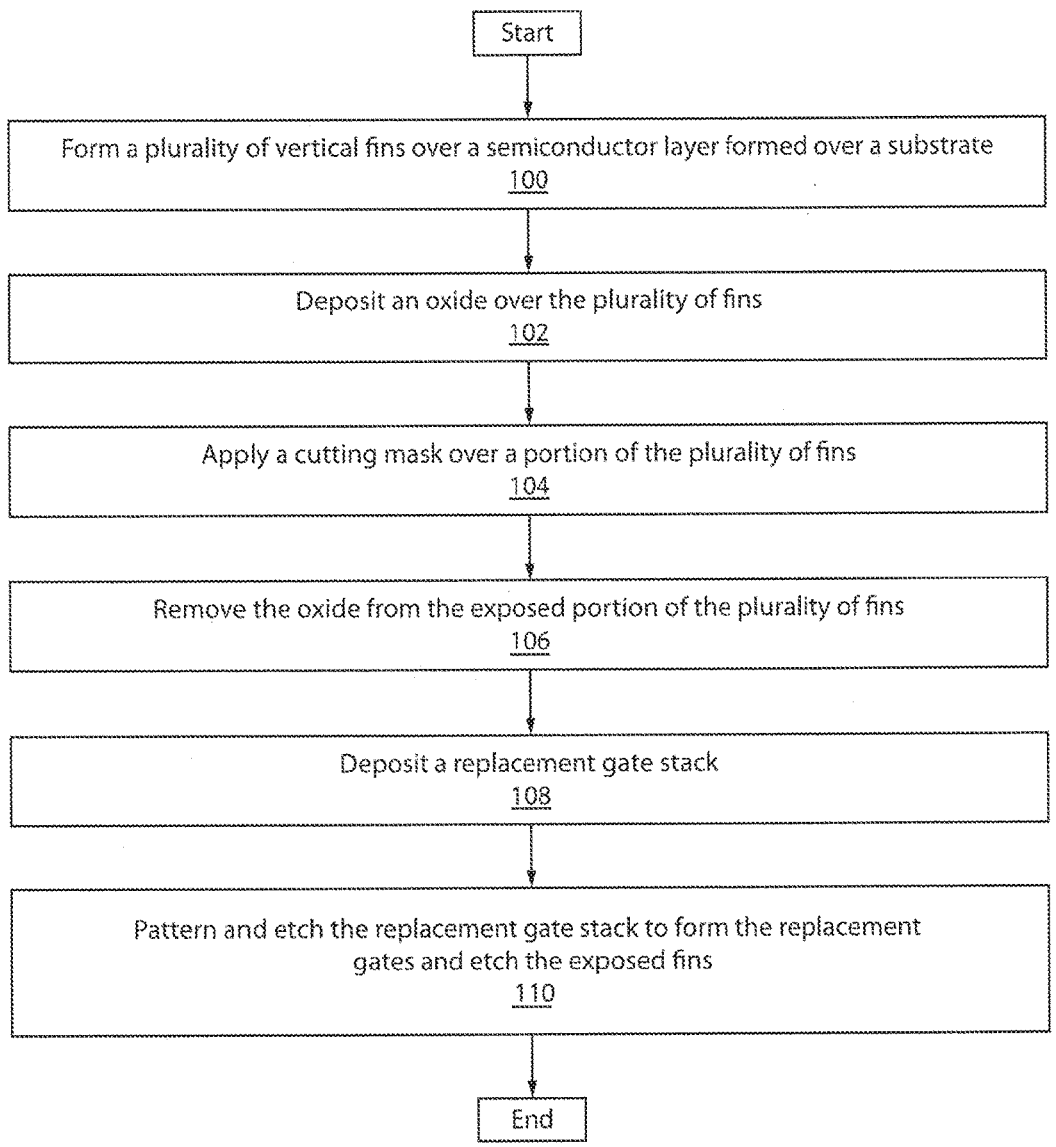
FIG. 29 is a block/flow diagram of an exemplary method for forming a finFET structure by cutting the fins during replacement gate formation, in accordance with an embodiment of the present invention.

FIG. 29 is a block/flow diagram of an exemplary method for forming a finFET structure by cutting the fins during replacement gate formation, in accordance with an embodiment of the present invention.

At block 100, a plurality of vertical fins are formed over a semiconductor layer formed over a substrate.

At block 102, an oxide is deposited over the plurality of fins.

At block 104, a cutting mask is applied over a portion of the plurality of fins.

At block 106, the oxide is removed from the exposed portion of the plurality of fins.

At block 108, a replacement gate stack is deposited.

At block 110, the replacement gate stack is patterned and etched to form the replacement gates and the exposed fins are etched.

It is to be understood that the present invention will be described in terms of a given illustrative architecture; however, other architectures, structures, substrate materials and process features and steps/blocks can be varied within the scope of the present invention.

It will also be understood that when an element such as a layer, region or substrate is referred to as being "on" or "over" another element, it can be directly on the other element or intervening elements can also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements can be present. In contrast, when an element is referred to as being "directly connected" or "directly coupled" to another element, there are no intervening elements present.

The present embodiments can include a design for an integrated circuit chip, which can be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer can transmit the resulting design by physical mechanisms (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein can be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., SiGe. These compounds include different proportions of the elements within the compound, e.g., SiGe includes $Si_xGe_{1-x}$ where x is less than or equal to 1, etc. In addition, other elements can be included in the compound and still function in accordance with the present embodiments. The compounds with additional elements will be referred to herein as alloys.

Reference in the specification to "one embodiment" or "an embodiment" of the present invention, as well as other variations thereof, means that a particular feature, structure, characteristic, and so forth described in connection with the embodiment is included in at least one embodiment of the present invention. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This can be extended, as readily apparent by one of ordinary skill in this and related arts, for as many items listed.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Spatially relative terms, such as "beneath," "below," "lower," "above," "upper," and the like, can be used herein for ease of description to describe one element's or feature's relationship to another element(s) or feature(s) as illustrated in the FIGS. It will be understood that the spatially relative terms are intended to encompass different orientations of the device in use or operation in addition to the orientation depicted in the FIGS. For example, if the device in the FIGS. is turned over, elements described as "below" or "beneath" other elements or features would then be oriented "above" the other elements or features. Thus, the term "below" can encompass both an orientation of above and below. The device can be otherwise oriented (rotated 90 degrees or at other orientations), and the spatially relative descriptors used herein can be interpreted accordingly. In addition, it will also be understood that when a layer is referred to as being "between" two layers, it can be the only layer between the two layers, or one or more intervening layers can also be present.

It will be understood that, although the terms first, second, etc. may be used herein to describe various elements, these elements should not be limited by these terms. These terms are only used to distinguish one element from another element. Thus, a first element discussed below could be termed a second element without departing from the scope of the present concept.

Having described preferred embodiments of a method of device fabrication and a semiconductor device thereby fabricated (which are intended to be illustrative and not limiting), it is noted that modifications and variations can be made by persons skilled in the art in light of the above teachings. It is therefore to be understood that changes may be made in the particular embodiments described which are within the scope of the invention as outlined by the appended claims. Having thus described aspects of the invention, with the details and particularity required by the patent laws, what is claimed and desired protected by Letters Patent is set forth in the appended claims.

What is claimed is:

1. A method of forming a semiconductor structure, the method comprising:
   forming a plurality of vertical fins over a semiconductor layer formed over a substrate;
   depositing an oxide over the plurality of fins;
   applying a cutting mask over a portion of the plurality of fins;
   removing the oxide from the exposed portion of the plurality of fins;
   depositing a replacement gate stack; and
   etching portions of the replacement gate stack to remove exposed fins to form recesses within the semiconductor layer.

2. The method of claim 1, further comprising depositing a spacer over the exposed fins and the recesses formed by the removed fins.

3. The method of claim 2, wherein the spacer is a non-conducting dielectric layer.

4. The method of claim 1, wherein a portion of the plurality of fins are cut during etching of the replacement gate stack.

5. The method of claim 1, wherein a portion of the oxide is removed before deposition of the replacement gate stack.

6. The method of claim 1, wherein the replacement gate stack includes a dummy gate and a gate hard mask.

7. The method of claim 6, wherein the dummy gate is formed of amorphous Si.

8. The method of claim 1, wherein the cutting mask is an organic planarization layer (OPL).

9. The method of claim 1, wherein each of the plurality of vertical fins is formed by Si.

10. The method of claim 1, wherein each of the plurality of vertical fins is formed by SiGe.

\* \* \* \* \*